United States Patent [19]

Porter

[11] Patent Number: 4,866,838

[45] Date of Patent: Sep. 19, 1989

[54] INTEGRATED CIRCUIT CHIP INSERTION AND REMOVAL TOOL

[75] Inventor: Warren W. Porter, Escondido, Calif.

[73] Assignee: NCR Corporation, Dayton, Ohio

[21] Appl. No.: 257,243

[22] Filed: Oct. 13, 1988

[51] Int. Cl.$^4$ ............................................. H05K 13/04
[52] U.S. Cl. ........................................ 29/741; 29/758; 29/764
[58] Field of Search ............... 29/741, 764, 758, 256, 29/258, 266, 278

[56] References Cited

U.S. PATENT DOCUMENTS

| | | | |
|---|---|---|---|
| 3,443,297 | 5/1969 | Lushy, Jr. | 29/203 |
| 3,516,142 | 6/1970 | DeRose et al. | 29/764 X |
| 3,896,533 | 7/1975 | Ullman et al. | 29/203 |
| 4,172,317 | 10/1979 | Kober et al. | 29/566 |
| 4,392,301 | 7/1983 | Hannes et al. | 29/741 |
| 4,507,861 | 4/1985 | Sprenkle | 29/741 |
| 4,583,287 | 4/1986 | McDevitt et al. | 29/741 |
| 4,597,174 | 7/1986 | Sevigny | 29/764 X |

*Primary Examiner*—Carl E. Hall
*Attorney, Agent, or Firm*—Wilbert Hawk, Jr.; Stephen F. Jewett; Gregory P. Gadson

[57] ABSTRACT

A tool for inserting and removing a component, such as a programmable gate array integrated circuit (PGA IC) chip. At least two blocks are mounted on a threaded rotatable shaft, the shaft for causing relative movement between the blocks when rotated. Resilient flanges which are biased outward are attached at one of their ends to the uppermost block, while rigid support flanges are attached to a lower block. The free ends of the resilient flanges contain catches for gripping a PGA IC or its socket (mounted on a printed circuit board, e.g.). For removal of the chip, the catches grip the IC, and the shaft is rotated to cause the IC to be pulled from the socket. For insertion, the catches grip the socket, and shaft rotation causes the lowest block to push the IC into the socket.

19 Claims, 6 Drawing Sheets

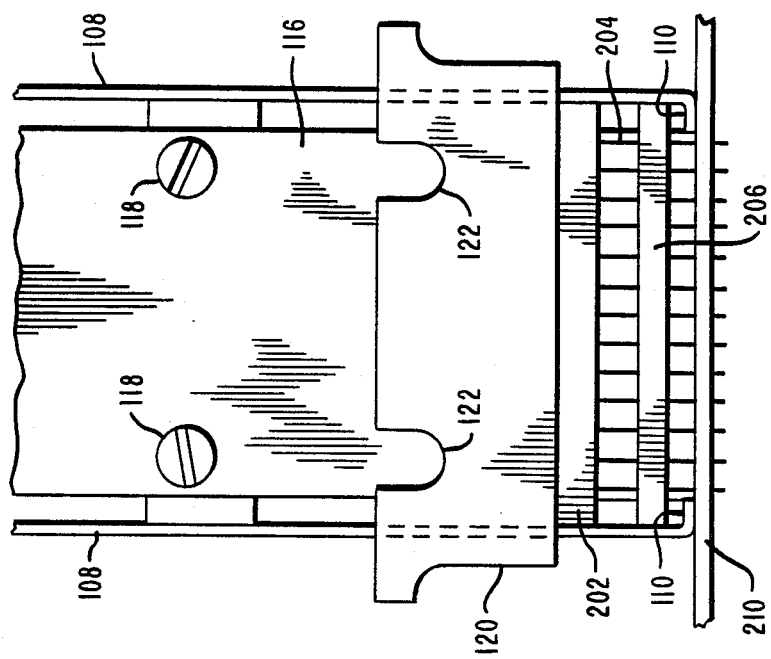
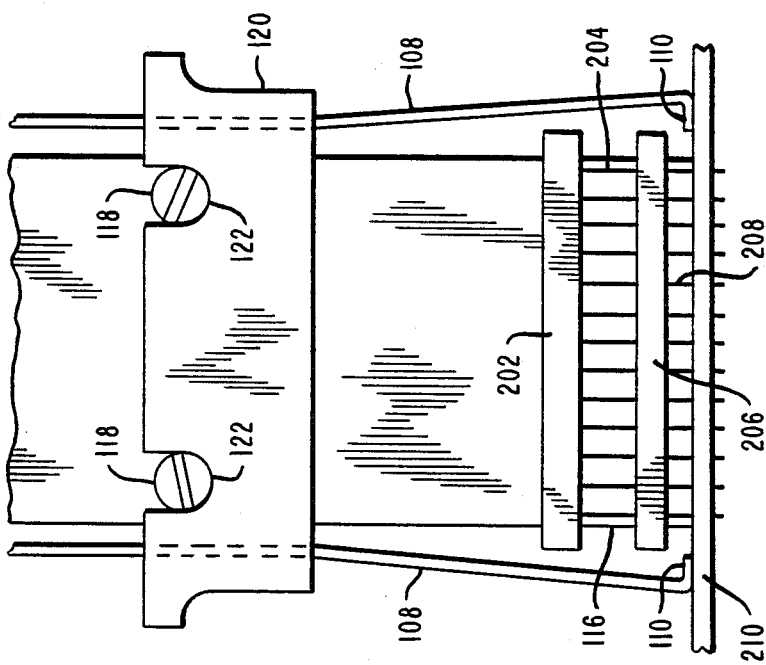

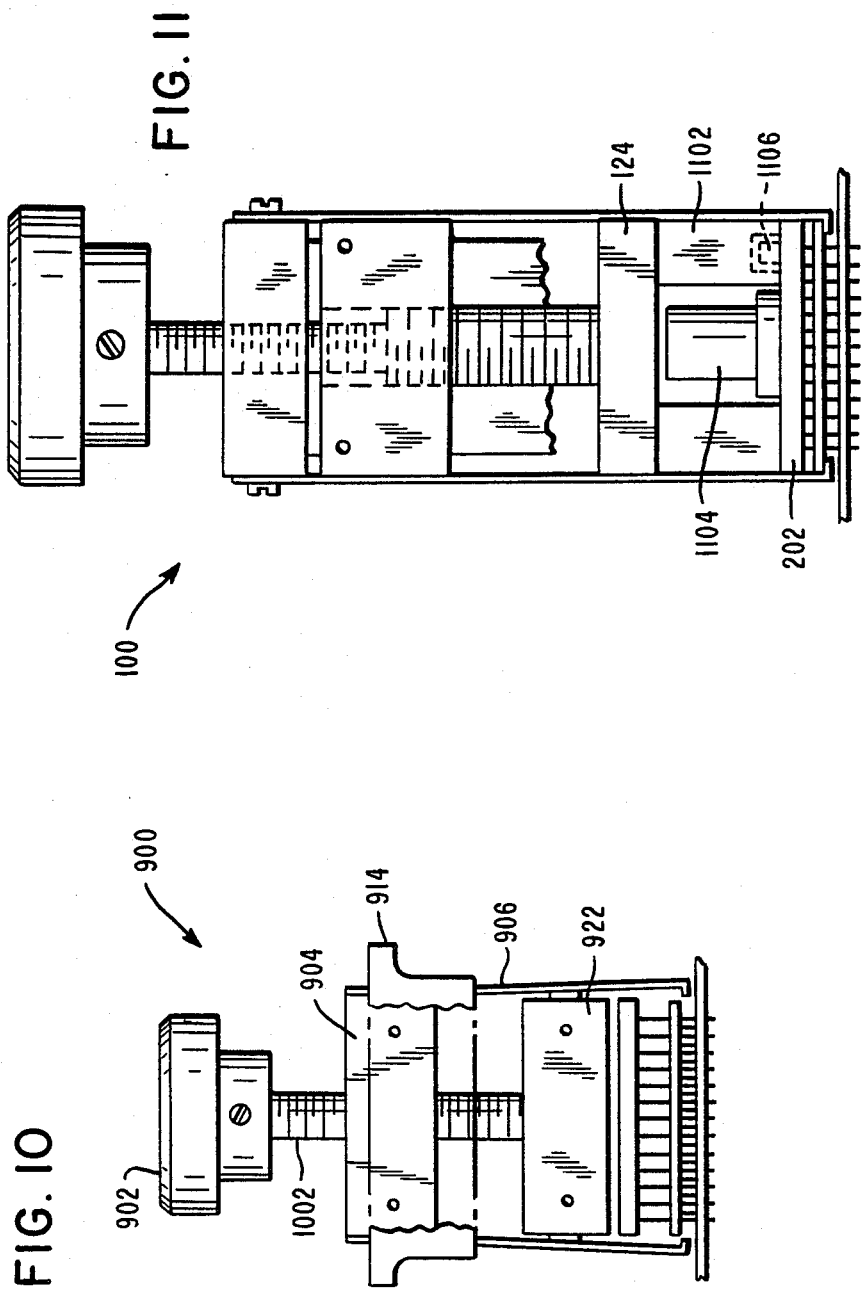

4,866,838

INTEGRATED CIRCUIT CHIP INSERTION AND REMOVAL TOOL

BACKGROUND OF THE INVENTION

The present invention generally relates to the insertion and removal of components and, more particularly to the insertion and removal of programmable gate array (PGA) integrated circuit (IC) chips with respect to sockets mounted upon a printed circuit board (PCB).

Prior art insertion or removal tools have been observed to be inoperable for use with PGA IC's. Hence the present invention was made to provide a tool for that purpose.

SUMMARY OF THE INVENTION

It is an object of the present invention to provide a tool for insertion or removal of electronic components, wherein such a tool has a simple configuration and simple operability.

It is yet another object of the present invention to provide such a tool with the ability to accommodate variances in IC chip and socket thickness combinations.

It is still a further object of the present invention to provide such a tool wherein the means for gripping the IC chip or the socket do not damage either the IC chip or socket pins.

An additional object of the present invention is to accomplish the above objects without damage to any protrusions emanating from the surface of an IC chip.

There is provided in accordance with the present invention a tool for use in the insertion or removal of an electronic component relative to a socket. The tool contains a first block and at least a second block mounted on a threaded shaft. Resilient flanges attached to the first block have a portion containing a gripper, which portion is biased outward. During operation, the grippers are made to grip the component or its socket when forced inward by an engagement means. During insertion of the component the grippers grip the socket, and rotation of the shaft causes the second block to bear on the component and push it into the socket.

The preferred embodiment of the present invention has a threaded rotatable shaft with the first part of the shaft having a first pitch and the second part of the shaft having a second pitch. The first part of the shaft is threadedly engaged by a first (upper) block and the second part is threadedly engaged by a second (middle) block. A third (lower) block is rotatably coupled to the end of the second part (which coincides with the end of the shaft). The shaft has a knob attached thereto at its other end to facilitate rotation.

Two opposed resilient flanges are attached at one of their ends to the upper block, and contain catches at their free ends. The resilient flanges are biased away from the shaft at their ends. Two opposed rigid support flanges are attached to the middle block. The flanges surround the three blocks, and generally surround the IC and the PCB mounted socket during an insertion or a removal operation. A slide or engagement means is slidably mounted around the flanges, which slide is positioned near the upper block when the tool is not in use, and near the lower block to move the catches inward when the tool is in use. Rotation of the shaft causes differential movement between the blocks.

During removal of an IC the resilient flanges are made to grip the IC, and the shaft is rotated counter-clockwise (viewed from the top). The relative movement of the upper and middle blocks is away from each other, causing the catches to pull the IC away from the socket while using the support flanges (resting on the PCB) for leverage. After removal of the IC from the socket, the slide is moved upward to release the catches and hence the IC chip. Although moving toward the upper block, the lower block plays no role in the removal of the IC chip.

During insertion of an IC the resilient flanges are made to grip the socket, and the shaft is rotated clockwise. The relative movement of the upper and lower blocks is away from each other, causing the lower block to impinge upon the IC and push it into the socket, using the socket as leverage. The relative movement of the middle block is toward the upper block, but it plays no role in the insertion process. After insertion, the catches are freed from the socket.

The details of the present invention will be revealed in the following description with reference to the attached drawings.

BRIEF DESCRIPTION OF THE DRAWINGS

FIG. 2 is a front view of the preferred embodiment with its slide disengaged.

FIG. 3 is a front view of the preferred embodiment with its slide engaged.

FIG. 1, is a perspective view of a first alternate embodiment of the present invention.

FIG. 10 is a front view, with portions removed, of the second alternate embodiment of the present invention.

FIG. 11 is a front view, with portions removed, of the preferred embodiment with adapter blocks.

DETAILED DESCRIPTION OF THE INVENTION

Figure 1:
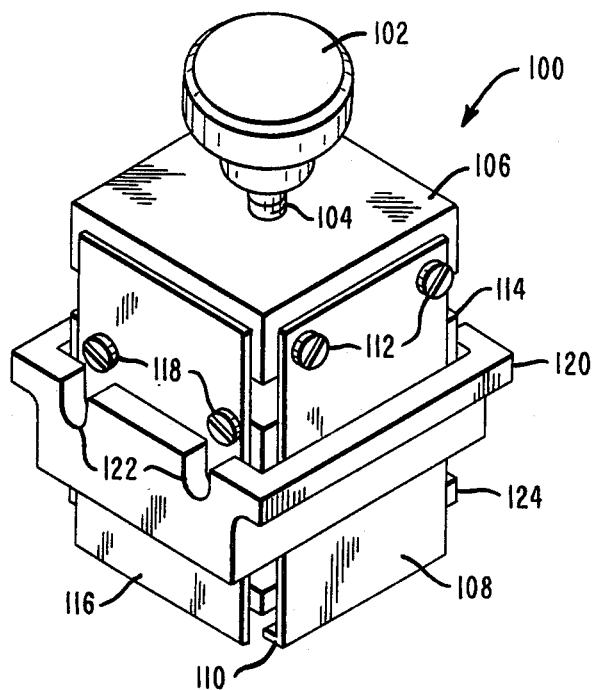
FIG. 1 is a perspective view of an IC chip insertion and removal tool which represents a preferred embodiment of the present invention.

Referring now to FIG. 1, the present inventive tool 100 is shown in perspective. A knob 102 is attached to a threaded rotatable shaft 104 which will be described in greater detail infra. The shaft 104 extends through an upper block or first block means 106. The upper block contains a threaded bore (not shown) which surrounds the shaft 104. Two opposed resilient flanges 108 having catches 110 at one of their ends are attached to the upper block 106 with mounting screws 112. The catches 110 extend inwardly and continuously along the one end of the flanges 108, and resemble small ledges.

The flanges 108 are such that the ends with catches 110 naturally spring away from the middle or center line of the tool 100. To accomplish this, the flanges 108 may have a slight curvature outward.

The tool 100 additionally contains a middle block or second block means 114 also threadedly mounted around the shaft 104. Two opposed rigid flanges 116 are attached on the middle block 114 with mounting screws 118. A slide or engagement means 120 surrounds the heretofore described components as shown in the Figure. The slide 120 contains cutouts 122 which are slightly larger than the diameter of the screws 118, and is movable along the vertical axis.

A lower block or third block means 124 is rotatably mounted at the end of the shaft 104, and is also enclosed by the flanges 108 and 116.

FIGS. 2 and 3 show the operation of the slide 120. Prior to insertion or removal of a PGA IC chip 202 (with contact pins 204) in or from a socket or socket means 206 (with mounting pins 208) mounted on a PCB 210, the slide 120 is in the upper position shown so that the cutouts 122 rest against the screws 118. Here, the resilient flanges 108 bow outward to allow clearance between them and IC chip 202 and socket 206.

When the slide 122 is moved by the operator to the lower position shown in FIG. 3, the flanges 108 are forced inward so that the catches 110 rest underneath the socket 206 as shown (during insertion), or underneath the IC chip 202 (during removal).

Figure 5:
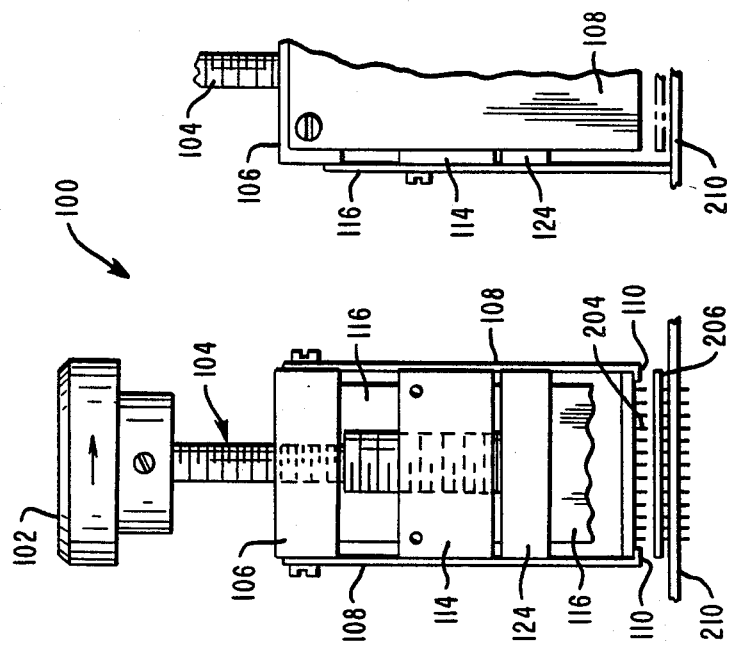
FIG. 5 is a front and accompanying side view, with portions removed, of the preferred embodiment after withdrawal of an IC chip.
Figure 4:
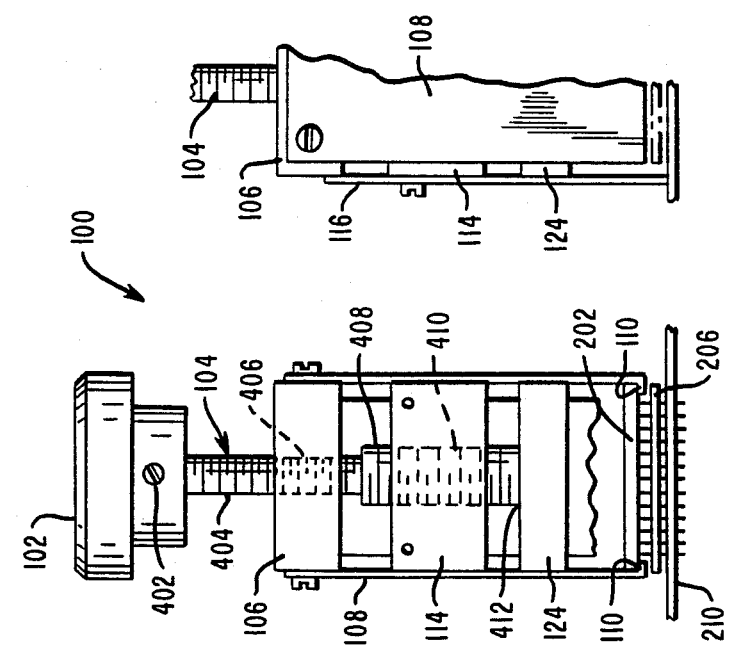
FIG. 4 is a front and accompanying side view, with portions removed, of the preferred embodiment before withdrawal of an IC chip.

FIG. 4 is a front view of the tool 100 and the associated side view prior to removal of the IC chip 202, while FIG. 5 illustrates the same views after removal of the IC chip 202 from the socket 206.

The shaft 104 may be secured to the knob 102 by a screw 402, for example. From FIG. 4 it is seen that the shaft 104 has a first part 404 with a first pitch, and a second part 408 with a second pitch, with the second pitch being the larger of the two. The differences in pitch of the two parts allows for differential movement of the three blocks, so that the middle block 114 moves at a faster rate when the shaft is rotated than the other blocks. The hole or bore 406 of the upper block 106 is threaded to match the shaft portion 404, while the threaded hole 410 of the middle block 114 matches the second portion of the shaft 408. The lower block 124 is rotatably (but not threadedly) mounted at the end of the shaft 104 as shown.

The rigid flanges 116 rest upon the surface of the PCB 210, while the resilient flanges 108 are made to grip the IC chip 202. The shaft is rotated counter-clockwise to cause the relative distance between the upper and middle blocks to increase, thus causing the IC chip 202 to be pulled from the socket 206 with the flanges 108, using the flanges 116 as leverage. After removal of the IC chip 202, the slide 120 is moved upward to allow the flanges 108 to spring outward and release the IC chip 202.

Figure 7:
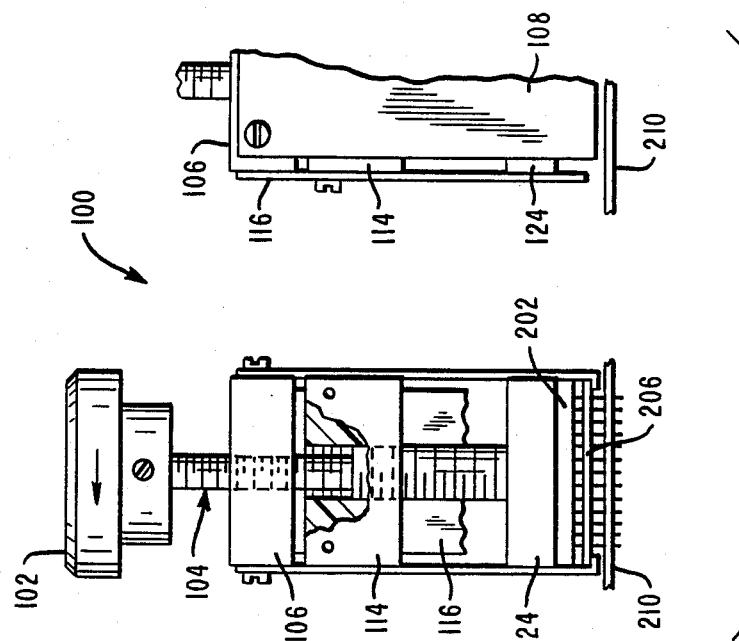
FIG. 7 is a front and accompanying side view, with portions removed, of the preferred embodiment after insertion of an IC chip.
Figure 6:
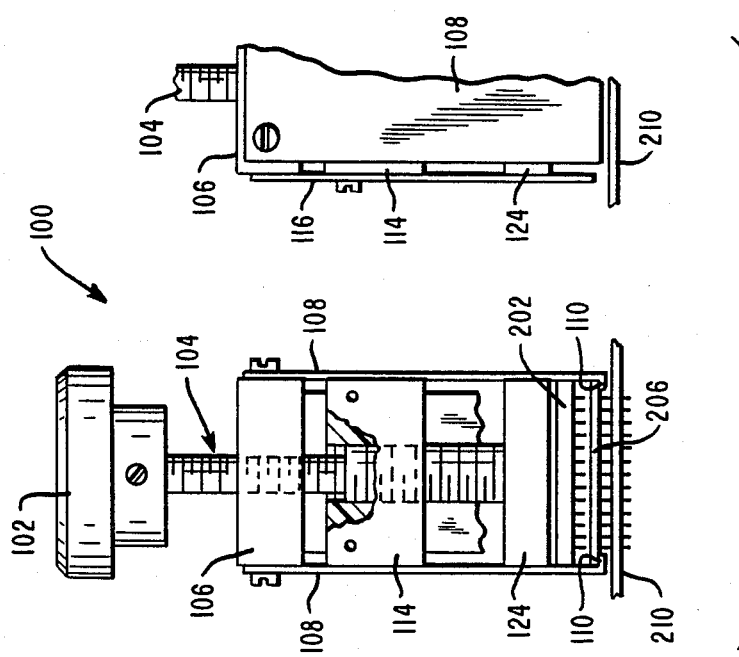
FIG. 6 is a front and accompanying side view, with portions removed, of the preferred embodiment before insertion of an IC chip.

FIGS. 6 and 7 illustrate before and after views, respectively, for insertion of an IC chip 202 into a socket 206. In this case the flanges 108 are made to grip the socket 206 rather than the IC chip 202. The shaft 104 is rotated clockwise as shown in FIG. 7 to move the lower block 124 downward. The operator continues to rotate the shaft until the lower block 124 pushes the IC chip 202 into the socket 206 using the flanges 108 (and thus the socket 206) for leverage. After the IC chip 202 is installed, the slide 120 is moved upward to release the socket 206 from the grasp of the flanges 108. The rigid flanges 116 have no role in the insertion operation.

It will be appreciated by those skilled in the art that the catches 110 may be replaced by other forms of grippers or gripper means with the same result.

Figure 8:
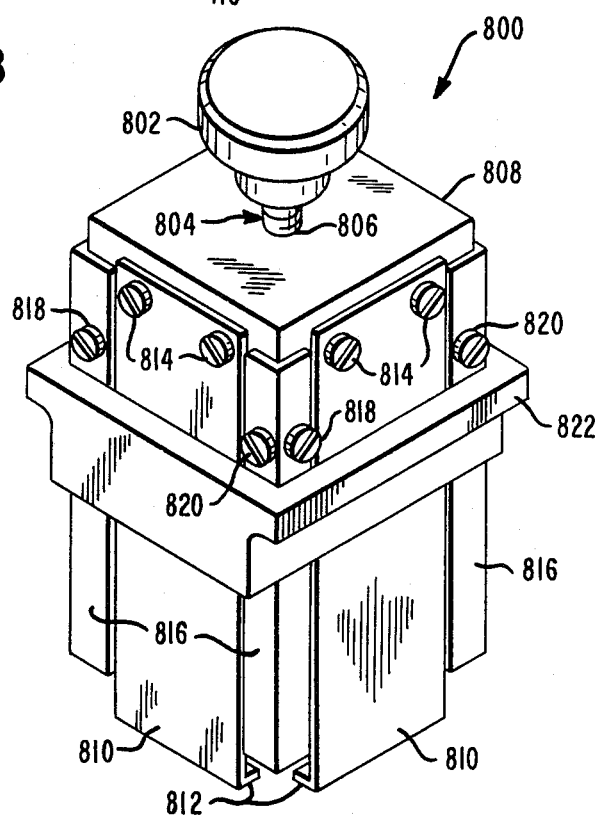
FIG. 8, on the sheet containing

FIG. 8 shows an alternate embodiment of the present invention. Instead of two opposed resilient flanges and two opposed rigid flanges, this tool 800 (having a knob 802, shaft 804 surrounded by bore 806 in upper block 808) contains a resilient flange 810, each with a ledge 812, attached to each wall of the upper block 808 with mounting screws 814. Additionally, a rigid flange 816 is mounted at each corner of the middle block (not shown in FIG. 8) with mounting screws 818 and 820, which are staggered as shown to prevent overlap of their respective bores in the middle block. A slide 822 operates as described supra. This embodiment has the advantage of increased rigidity and load sharing, which are necessary when large PGA IC chips are being removed or inserted.

Figure 9:
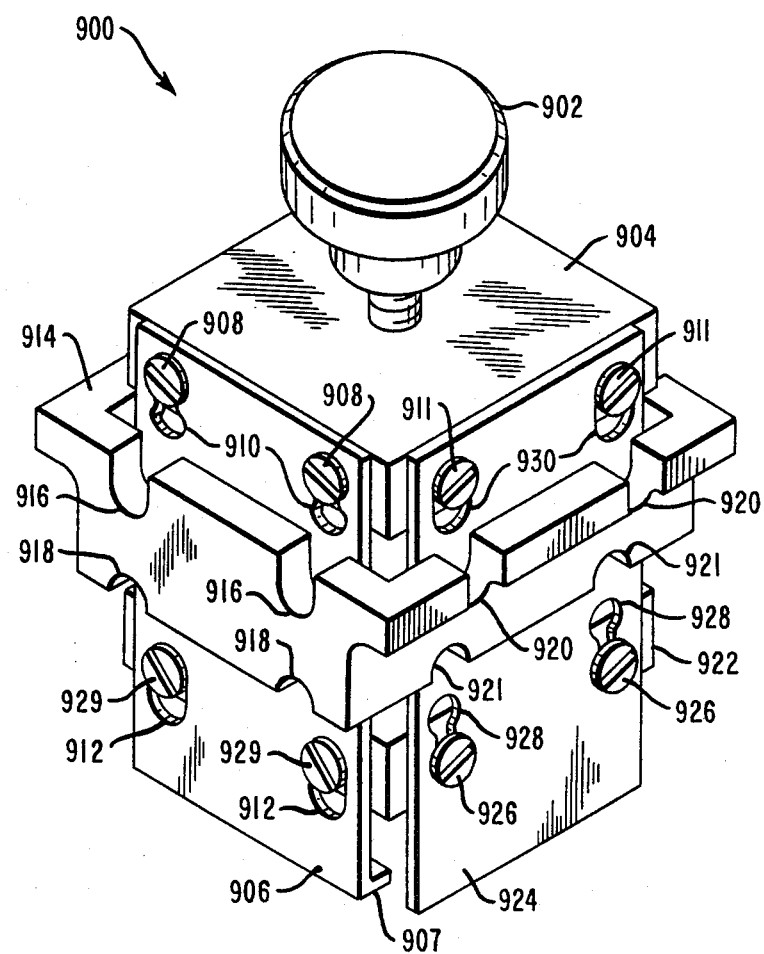
FIG. 9 is a perspective view of a second alternate embodiment of the present invention.

FIGS. 9 and 10 show another alternate embodiment 900 for the present inventive tool. This embodiment, however, is best suited for insertion operations. All components function as the corresponding components in the tool 100. There are two distinct differences, however, in this embodiment.

First, there are only two blocks. The lower block 922 of this embodiment functions both as the middle block 114 and the lower block 124 of tool 100. Therefore its support flanges 924 are attached to its lower block 920 with screws 926. The resilient flanges 906 having catches 907 are attached to the upper block 904 in a manner similar to that of the preferred embodiment.

The oval-shaped voids 912 allow the lower block 922 to translate while the flanges 906 are flush with the lower block 922 when the slide 914 is in the lower (engaged) position. The voids 930 serve the same function for the support flanges 924 and the upper block 904, so that the support flanges 924 are always flush with the upper block 904. The voids 910 and 928 allow the screws 908 and 926 to fasten flanges 906 and 924 to their respective blocks. The cutouts 916, 918, 920 and 921 serve to increase the amount of translation possible by the slide 914. The screws 908, 911, 926 and 929 all serve as flange fasteners, as previously described for the preferred embodiment. The knob 902 has a function identical to the previously described knobs.

Turning now to FIG. 10, the shaft 1002 of the tool 900 has only one threaded portion, which threaded portion extends through only the upper block 904. This embodiment, thus, does not produce differential movement between its blocks.

Finally, FIG. 11 illustrates how adapter blocks 1102 (alterable extensions of the lower block 124) may be used with the tool 100 to aid in insertion of an IC chip 202 which has surface components or protrusions from its upper surface, such as a heat sink stud 1104 or other component 1106 (such as a decoupling capacitor). The adapter blocks 1102 provide clearances for the surface components or protrusions (e.g., 1104 and 1106). This allows insertion of an IC without damage to its surface components.

Variations and modifications to the present invention are possible given the above disclosure. However, such variations and modifications are intended to be within the scope of the invention claimed by this letters patent.

I claim:

1. A tool for use in the insertion or removal of an electronic component relative to a socket, said tool comprising:

a threaded, rotatable shaft having a first part and a second part;

a first block threadedly coupled to the first part of said shaft;

a second block coupled to the second part of said shaft;

at least a third block coupled substantially to an end of the second part, wherein rotation of said shaft causes differential, axial movement between said blocks; and at least two gripper flanges coupled to said first block and each having a gripper located on a portion thereof;

said component being located between said third block and said socket during the operation of said tool;

so that, when said tool is used to insert said component, said shaft is rotated in a first direction and causes said grippers and said third block to move toward each other, said grippers gripping said socket and holding said socket and said first block stationary relative to each other, and said third block bearing on said component and causing said component to be inserted into said socket.

2. The tool in claim 1 further comprising:

at least two support flanges coupled to said second block;

so that, when said tool is used to remove said component, said shaft is rotated in a second direction, said gripper gripping said component and holding said component and said first block stationary relative to each other while said support flanges rest upon said socket or a surface supporting said socket, and said grippers pulling said component and causing said component to be removed from said socket.

3. The tool in claim 2 wherein said gripper flanges are resilient and are biased outward at the portions having said grippers, and further comprising:

engagement means coupled to said gripper flanges for forcing said biased portions of said gripper flanges toward said component and said socket during the operation of said tool in order to provide a gripping action by each said gripper.

4. The tool in claim 1 further comprising at least one adapter block positioned between said third block and the surface of to provide a clearance for protrusions on the surface of said component during insertion of said component.

5. The tool in claim 1 wherein said component is an integrated circuit chip.

6. The tool in claim 2 wherein said component is an integrated circuit chip.

7. A tool for use in the insertion or removal of an electronic component relative to a socket, said tool comprising:

a threaded, rotatable shaft having a first part with a first pitch and a second part with a second pitch;

a first block threadedly coupled to the first part of said shaft so that, when said shaft is rotated relative to said first block, said first block moves axially relative to said shaft;

a second block coupled to said shaft;

at least a third block threadedly coupled to the second part of said shaft between said first and second blocks, wherein rotation of said shaft causes differential, axial movement between said blocks;

at least two resilient flanges coupled to said first block and having at least a portion biased outward, with a gripper located on said biased portion;

at least two support flanges coupled to said second block; and engagement means coupled to said resilient flanges for forcing said biased portion of said resilient flanges toward said component and said socket during the operation of said tool in order to provide a gripping action by each said gripper;

said component being located between said second block and said socket during the operation of said tool;

so that, when said tool is used to insert said component, said shaft is rotated and causes said gripper and said second block to move toward each other, said gripper gripping said socket and holding said socket and said first block stationary relative to each other, and said second block bearing on said component and causing said component to be inserted into said socket, and when said tool is used to remove said component, said shaft is rotated in a second direction, said gripper gripping said component and holding said component and said first block stationary relative to each other while said support flanges rest upon said socket or a surface supporting said socket, and said grippers pulling said component and causing said component to be removed from said socket.

8. The tool in claim 7 wherein said component is an integrated circuit chip.

9. A tool for use in the insertion or removal of an electronic component relative to a socket, said tool comprising:

a threaded, rotatable shaft having a first part with a first pitch, and a second part with a second pitch;

a first block threadedly coupled to the first part of said shaft;

a second block threadedly coupled to the second part of said shaft;

a third block coupled substantially to the end of the second part, wherein rotation of said shaft causes differential, axial movement between said blocks;

at least two resilient flanges coupled to said first block and having at least a portion biased outward, with a gripper located on said biased portion;

at least two support flanges coupled to said second block; and engagement means coupled to said resilient flanges for forcing said biased portion of said resilient flanges toward said component and said socket during the operation of said tool in order to provide a gripping action by each said gripper;

said component being located between said third block and said socket during the operation of said tool;

so that, when said tool is used to insert said component, said shaft is rotated in a first direction and causes said gripper and said third block to move toward each other, said gripper gripping said socket and holding said socket and said first block stationary relative to each other, and said third block bearing on said component and causing said component to be inserted into said socket.

10. The tool in claim 9, wherein:

when said tool is used to remove said component, said shaft is rotated in a second direction, said gripper gripping said component and holding said component and said first block stationary relative to each other while said support flanges rest upon said socket or a surface supporting said socket, and said grippers pulling said component and causing said component to be removed from said socket.

11. The tool in claim 9 wherein said support flanges are coupled to corners of said second block, and said resilient flanges are arranged between said support flanges.

12. The tool in claim 10 wherein said support flanges are coupled to corners of said second block, and said resilient flanges are arranged between said support flanges.

13. The tool in claim 9 further comprising at least one adapter block positioned between said third block and the surface of said component to provide a clearance for protrusions on the surface of said component during insertion of said component.

14. The tool in claim 9 wherein said component is an integrated circuit chip.

15. The tool in claim 10 wherein said component is an integrated circuit chip.

16. A tool for use int he insertion or removal of an electronic component relative to a socket, said tool comprising:
   a threaded, rotatable shaft having a first part and a second part;
   a first block threadedly coupled to the first part of said shaft;
   a second block coupled to the second part of said shaft;
   at least a third block coupled substantially to an end of the second part, wherein rotation of said shaft causes differential, axial movement between said blocks;
   at least two gripper flanges coupled to said first block and each having a gripper located on a portion thereof; and
   at least two support flanges coupled to said second block;
   said component being located between said third block and said socket during the operation of said tool;
   so that, when said tool is used to remove said component, said shaft is rotated, said grippers gripping said component and holding said component and said first block stationary relative to each other while said support flanges rest upon said socket or a surface supporting said socket, and said grippers pulling said component and causing said component to be removed from said socket.

17. The tool in claim 16 wherein said gripper flanges are resilient and are biased outward at the portions having said grippers, and further comprising:
   engagement means coupled to said gripper flanges for forcing said biased portions of said gripper flanges toward said component and said socket during the operation of said tool in order to provide gripping action by each said gripper.

18. The tool in claim 16 wherein said component is an integrated circuit chip.

19. The tool in claim 17 wherein said component is an integrated circuit chip.

* * * * *